United States Patent
Amann (10) Patent No.: US 7,376,163 B2
(45) Date of Patent: May 20, 2008

(54) METHOD FOR PRODUCING A WAVEGUIDE STRUCTURE IN A SURFACE-EMITTING SEMICONDUCTOR LASER AND SURFACE-EMITTING SEMICONDUCTOR LASER

(75) Inventor: Markus Christian Amann, München (DE)

(73) Assignee: Vertilas GmbH, Garching (DE)

( * ) Notice: Subject to any disclaimer, the term of this patent is extended or adjusted under 35 U.S.C. 154(b) by 166 days.

(21) Appl. No.: 10/544,333

(22) PCT Filed: Nov. 19, 2003

(86) PCT No.: PCT/EP03/12968

§ 371 (c)(1),
(2), (4) Date: Aug. 4, 2005

(87) PCT Pub. No.: WO2004/070899

PCT Pub. Date: Aug. 19, 2004

(65) Prior Publication Data

US 2006/0078029 A1    Apr. 13, 2006

(30) Foreign Application Priority Data

Feb. 4, 2003  (DE) ................................ 103 04 432
Apr. 17, 2003  (DE) ................................ 103 17 970

(51) Int. Cl.
*H01S 5/00* (2006.01)

(52) U.S. Cl. ............................. 372/46.015; 372/45.01; 372/46.01; 372/45.012; 372/46.011

(58) Field of Classification Search ................... 372/64, 372/46, 45.012

See application file for complete search history.

(56) References Cited

U.S. PATENT DOCUMENTS

| | | | | |
|---|---|---|---|---|
| 5,311,534 | A * | 5/1994 | Mori et al. ............... | 372/46.01 |
| 5,625,637 | A * | 4/1997 | Mori et al. .................... | 372/96 |
| 5,805,624 | A * | 9/1998 | Yang et al. .............. | 372/45.01 |
| 6,052,398 | A * | 4/2000 | Brillouet et al. ......... | 372/46.01 |
| 6,687,281 | B2* | 2/2004 | Coldren et al. ................ | 372/96 |
| 6,771,680 | B2* | 8/2004 | Bour et al. .............. | 372/43.01 |

(Continued)

OTHER PUBLICATIONS

J. Boucart et al., "1-mW CW-RT Monolithic VCSEL at 1.55 .mu.m," IEEE Photonics Technology Letters, vol. 11, pp. 629-631 (1999).

(Continued)

Primary Examiner—Minsun Oh Harvey
Assistant Examiner—Patrick Stafford
(74) Attorney, Agent, or Firm—Lathrop & Gage LC (57) ABSTRACT

Methods for producing surface-emitting semi-conductor lasers with tunable waveguiding are disclosed. The laser comprises an active zone containing a pn-transition, surrounded by a first n-doped semiconductor layer and at least one p-doped semiconductor layer. In addition to a tunnel junction on the p-side of the active zone, the tunnel junction borders a second n-doped semi-conductor layer with the exception of an area forming an aperture. An n-doped layer is provided between the layer provided for the tunnel junction and the at least one p-doped semiconductor layer. The tunnel junction may be arranged in a maximum or minimum of the vertical intensity distribution of the electric field strength. This enables surface-emitting laser diodes to be produced in high yields with stabilization of the lateral single-mode operation, high performance and wave guiding properties.

18 Claims, 5 Drawing Sheets

U.S. PATENT DOCUMENTS

2001/0050934 A1    12/2001    Klem et al.

OTHER PUBLICATIONS

K.D. Choquette, et al., "Room Temperature Continuous Wave InGaAsN Quantum Well Vertical-Cavity Lasers Emitting At 1.3 Microm," Electronics Letters, IEE Stevenage, GB, vol. 36, No. 16, Aug. 3, 2000.

S. Sekiguchi, et al. "Selectively Formed ALAS/INP current confining Tunnel Junction For Gainasp/INP Surface Emitting Lasers" 11th International Conference on Indium Posphide And Related Materials, Conference Proceedings, IPRM Davos, New York, NY, May 16-20, 1999.

International Preliminary Examination Report dated May 2, 2005 issued in related PCT application PCT/EP2003/012968.

* cited by examiner

METHOD FOR PRODUCING A WAVEGUIDE STRUCTURE IN A SURFACE-EMITTING SEMICONDUCTOR LASER AND SURFACE-EMITTING SEMICONDUCTOR LASER

RELATED APPLICATIONS

This application claims the benefit of priority to PCT/EP2003/012968, filed Nov. 19, 2003, which claimed priority to German patent application serial numbers 103 04 432.9 and 103 17 970.4, filed Feb. 4, 2003 and Apr. 17, 2003; each of these applications is incorporated herein by reference.

BACKGROUND

Surface-emitting laser diodes or Vertical-Cavity Surface-Emitting Lasers (VCSEL) are semiconductor lasers, in which light emission occurs perpendicular to the surface of the semiconductor chip. Compared with conventional edge-emitting laser diodes the surface-emitting laser diodes have numerous advantages such as low electrical power consumption, the possibility of direct monitoring of the laser diode on the wafer, ease of coupling to a glass fiber, production of longitudinal single mode spectra and the possibility of connecting the surface-emitting laser diodes together to form a two-dimensional matrix.

In the field of fiberoptic communications technology—because of the wavelength-dependent dispersion or absorption—devices producing radiation in a wavelength range from about 1.3 to 2 µm, and in particular wavelengths of about 1.31 µm or 1.55 µm, are needed. Longwave laser diodes with useful properties, particularly for the wavelength range above 1.3 µm, have been produced from InP-based connecting semiconductors. GaAs-based VCSELs are suitable for the shorter wavelength range of less than 1.3 µm.

A continuous wave VCSEL which emits at an output of 1 mW at 1.55 µm has been constructed of an InP substrate with metamorphic layers or mirrors (*IEEE Photonics Technology Letters*, 11(6), June 1999, pp. 629-631). Lateral wave guiding is achieved by proton implanting.

A VCSEL produced in a single epitactic growth process with an output of 0.45 mW at a wavelength of 1.5 to 1.6 µm with a metamorphic mirror on the light emitting side is known from "High Performance 1.6 µm Single-Epitaxy Top-Emitting VCSEL", (Conference on Lasers & Electro-Optics (CLEO) 2000, San Francisco, USA, Post-Deadline Paper CPD 12, pp. 23-24). Current and wave guiding were achieved by selective oxidation.

A VCSEL with an air-semiconductor mirror (InP—air gap Distributed Bragg Reflectors (DBRs)) was proposed in IEEE ISLC 2002, pp. 145-146. A tunnel junction was applied between the active zone and the upper DBR mirror, whereby a current was achieved by under-etching the tunnel junction layer. The air gap surrounding the remaining tunnel junction area serves as a waveguide for the optical field.

A VCSEL with antimonide-based mirrors, in which an under-etched InGaAs active zone is enclosed by two n-doped InP layers, adjoined by AlGaAsSb-DBR mirrors, is known from the 26th European Conference on Optical Communication, ECOC 2000, "88° C., Continuous-Wave Operation of 1.55 µm Vertical-Cavity Surface-Emitting Lasers". The selective under-etching in this case brings about lateral wave guiding.

The optimum properties in terms of performance, operating temperature range, single mode power and modulation bandwidth, however, are found in VCSELs with buried tunnel junctions (BTJs). The manufacture and structure of the buried tunnel junction will be described hereinafter with reference to FIG. 1. A highly doped $p^+/n^+$ pair of layers 101, 102 with a small band spacing is produced by molecular beam epitaxy (MBE). The actual tunnel junction 103 is formed between these layers. By reactive ion etching (RIE) a circular or elliptical area is shaped, which is essentially formed by the $n^+$-doped layer 102, the tunnel junction 103 and some or all of the $p^+$-doped layer 101. This area is overgrown with n-doped InP (layer 104) in a second epitaxy procedure, so that the tunnel junction 103 is "buried". The contact area between the overgrown layer 104 and the $p^+$-doped layer 101 acts as a barrier layer when voltage is applied. The current flows through the tunnel junction with resistances of typically $3\times10^{-6}$ $\Omega$ cm$^2$. In this way, the current flow can be restricted to the actual area of the active zone 108. Moreover, little heat is generated, as the current flows from a high-resistance p-doped layer to a low resistance n-doped layer.

The overgrowing of the tunnel junction leads to slight variations in thickness which have an unfavorable effect on lateral wave guiding, with the result that the production of higher lateral modes is made easier, particularly in the case of larger apertures. Therefore, only small apertures can be used with less corresponding laser power for single mode operation, which is required in fiber optic communications technology.

Examples and applications of VCSELs with buried tunnel junctions can be found, for example, in "Low-threshold index-guided 1.5 µm long wavelength vertical-cavity surface-emitting laser with high efficiency", *Applied Physics Lett.*, 76(16), Apr. 17, 2000, pp. 2179-2181; in "Long Wavelength Buried-Tunnel-Junction Vertical-Cavity Surface-Emitting Lasers", *Adv. in Solid State Phys.* 41, 75-85, 2001; in "Vertical-cavity surface-emitting laser diodes at 1.55 µm with large output power and high operation temperature", *Electronics Letters*, 37(21), Oct. 11, 2001, pp. 1295-1296; in "90° C. Continuous-Wave Operation of 1.83 µm Vertical-Cavity Surface-Emitting Lasers", *IEEE Photonics Technology Letters*, 12(11), November 2000, pp. 1435-1437; and in "High-speed modulation up to 10 Gbit/s with 1.55 µm wavelength InGaAlAs VCSELs", *Electronics Letters*, 38(20), Sep. 26, 2002. Lateral wave guiding is provided in these examples by lateral variation in the resonator length.

The structure of the InP-based VCSEL discussed in the above-mentioned literature will be briefly explained below with reference to FIG. 2, starting from the structure of the buried tunnel junction in FIG. 1 described above.

Figure 1:
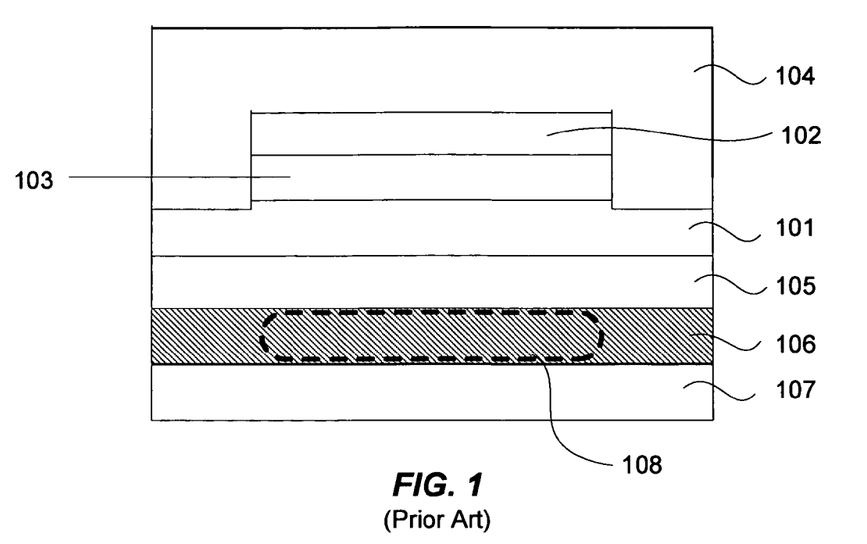
FIG. 1 schematically shows the structure of a buried tunnel conjunction for a surface-emitting semiconductor laser according to the prior art.
Figure 2:
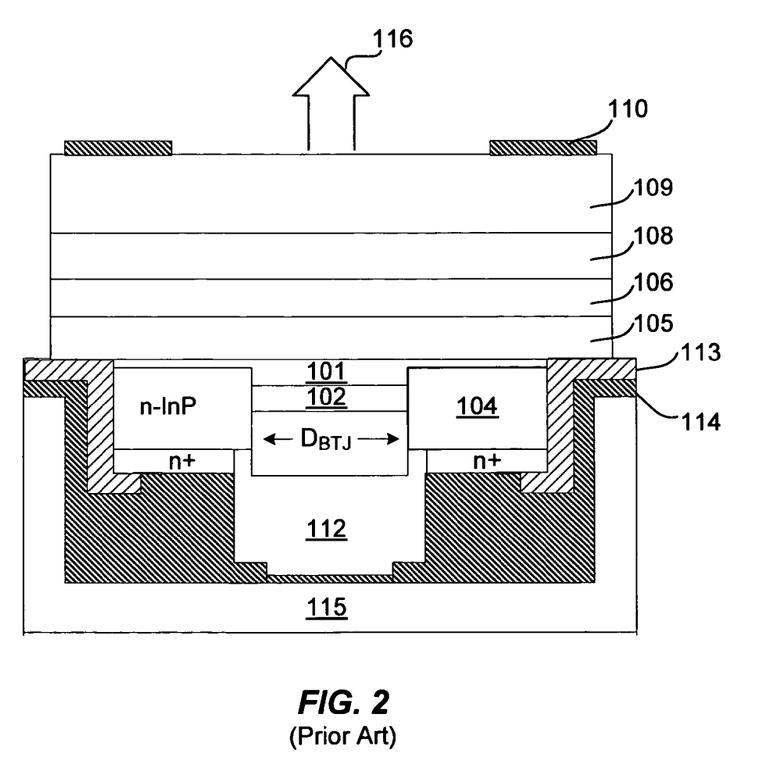
FIG. 2 schematically shows the structure of a known surface-emitting semiconductor laser with a buried tunnel junction.

The Buried Tunnel Junction (BTJ) in this structure is arranged in reverse relative to FIG. 1. The active zone 106 is situated above the tunnel junction having a diameter $D_{BTJ}$ determined by the $p^+$-doped layer 101 and the $n^+$-doped layer 102. The laser radiation travels in the direction indicated by arrow 116. The active zone 106 is surrounded by a p-doped layer 105 (InAlAs) and an n-doped layer 108 (InAlAs). A front mirror 109 above the active zone 106 consists of an epitaxial DBR with 35 pairs of InGaAlAs/InAlAs layers, producing a reflectivity of about 99.4%. A rear mirror 112 consists of a stack of dielectric layers as DBRs and ends with a layer of gold, producing a reflectivity of nearly 99.75%. An insulating layer 113 prevents direct contact of the n-InP layer 104 with the p-end contact layer 114, which is generally comprised of gold or silver (in this context see DE 101 07 349 A1). Reference numeral 111 designates the p-end contact layer which is annular in structure.

The combination of the dielectric mirror 112, the integrated contact layer 114 and heat sink 115 results in a significantly increased thermal conductivity compared to epitaxial multi-layer structures. Current is injected through the contact layer 114 or through the integrated heat sink 115 and the n-end contact points 110. For further details of the manufacture and properties of the VCSEL types shown in FIG. 2, express reference is made to the literature mentioned above.

In the proposed VCSEL diodes, particularly for the wavelength range between about 1.3 and 2 µm, there is a need to be able to adjust the lateral radiation profile thereof within wide ranges by lateral wave guiding. Here, too, manufacturing should take place with the usual epitaxial overgrowth, and for this reason Al-free InP-based VCSELs, in particular, are suitable for wavelengths above 1 µm.

In GaAs-based VCSELs, which can only be used in wavelength ranges below about 1.3 µm, lateral wave guiding is produced by selectively oxidized AlAs layers (in this context see "Advances in Selective Wet Oxidation of AlGaAs Alloys", in *IEEE Journal of Selected Topics in Quantum Electronics*, 3(3), June 1997, pp. 916-926). The VCSEL discussed therein consists of multiple layers of GaAs—AlGaAs, produced epitaxially by Metal Organic Vapour Phase Epitaxy (MOVPE). By wet oxidation of the AlGaAs layers, buried oxide layers are formed which leave an unoxidized aperture open in the center of the VCSEL. This method has not hitherto been successfully applied to the InP-based VCSELs, as AlAs cannot be applied or can only be applied in layers that are too thin because of mismatching of the lattice constants, and other oxidizable materials such as, for example, AlGaSb have hitherto not produced an oxide layer of sufficient quality. Therefore, with long wave VCSELs, other methods of lateral wave guiding have been used, such as for example lateral variation of the resonator length, selectively etched layers, proton implanting or metamorphic AlAs layers, as explained above in connection with references cited.

SUMMARY

An InP-based surface-emitting laser diode may be produced more economically and in higher yield, and such that the lateral radiation profile can be adjusted within wide ranges by lateral wave guiding. Moreover, stable lateral single mode operation and high efficiencies may be achievable with large apertures.

In an embodiment, a method is disclosed for producing a waveguide structure in a surface-emitting semiconductor laser and a surface-emitting semiconductor layer.

A process according to an embodiment for producing a waveguide structure in a surface-emitting semiconductor laser with an active zone having a pn transition, surrounded by a first n-doped semiconductor layer and at least one p-doped semiconductor layer, and with a tunnel junction on the p-side of the active zone which is adjacent to a second n-doped semiconductor layer, includes: applying, in a first epitactic growth process, an n-doped barrier layer onto the minimum of one p-doped semiconductor layer, this n-doped barrier layer subsequently being at least partly removed in order to form an aperture; and then, in a second epitactic growth process, applying the layer provided for the tunnel junction to the barrier layer and the aperture.

A process according to an embodiment thus results in the following epitactic structure outside the area of the aperture (from the bottom upwards): the p-doped semiconductor layer adjacent to the active zone, the n-doped barrier layer; the tunnel junction consisting of a highly p- and n-doped semiconductor layer; and the second n-doped semiconductor layer. In this overgrown structure, the electrical current (polarity + at the top and − at the bottom) can flow only in the region of the aperture (without the barrier layer) as a blocking p-n-p-n-structure has been produced outside of the aperture. In particular, the interface between the barrier layer and the n-doped semiconductor layer between the barrier layer and active zone has a good barrier effect. As a result, the laser-active region within the active zone or laser-active layer is laterally substantially determined by the shape and size of the aperture. At the same time, lateral wave guiding which is also determined by the aperture can be obtained by a suitable choice of the layer thickness of the barrier layer, which is therefore laterally adjusted precisely to the laser-active region (automatic self-adjustment).

The barrier layer includes an n-doped material which is preferably selectively etchable against the material of the adjacent p-doped semiconductor layer. For example, this p-doped semiconductor layer consists of InP and the barrier layer consists of InGaAsP. In a lithographic and etching process, a round, elliptical, square, rectangular or otherwise shaped aperture is produced in the barrier layer, going through to the adjacent p-doped semiconductor layer.

It should be noted that the tunnel junction layer generally has a powerful absorbing effect on laser radiation as a result of the high dopings and/or small band distances needed for the tunnel effect. Therefore it is advisable to locate the active zone within the aperture, i.e., in the laser-active area, in a maximum of the vertical intensity distribution of the electric field strength in order to maximize the amplification; whereas the tunnel junction within the aperture should be located in a minimum of the vertical intensity distribution of the electric field strength in order to minimize losses. The vertical position of the tunnel junction layer outside the aperture, on the other hand, depends on the thickness of the barrier layer and may be situated, for example, in a maximum of the field or in a minimum of the field. Accordingly, the layer thickness of the barrier layer may be selected within a range from about 0 to the distance of a minimum to the next maximum of the field (=half a spacing of successive maxima or minima). It may be appropriate to form the barrier layer from a plurality of individual layers.

As explained hereinafter in connection with the exemplifying embodiments, if the vertical position of the tunnel junction outside the aperture is in a maximum of the field, the basic mode is narrowed down to the aperture and higher modes are greatly attenuated, owing to their stronger field spurs (extensions) in the outer region, and therefore cannot start up (begin to oscillate). If, on the other hand, the thickness of the barrier layer is made very small, so that the vertical position of the tunnel junction outside the aperture is located in a minimum of the field, little or no wave guiding is produced. Thus, by a suitable choice of thickness for the barrier layer, particularly in the area specified, the lateral wave guiding and mode selection can be continuously adjusted within a wide range.

DETAILED DESCRIPTION

The manufacture and structure of a known BTJ-VSCEL have already been described in connection with FIGS. 1 and 2. Therefore, in the description that follows, the differences in the manufacture and structure of the semiconductor laser according to the present instrumentalities will be particularly emphasised.

Figure 3:
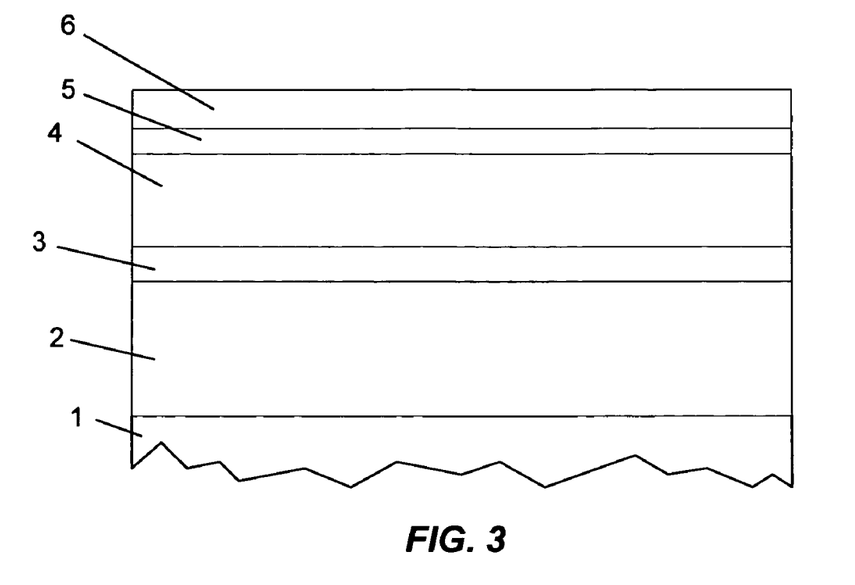
FIG. 3 shows a typical epitactic starting structure for a surface-emitting semiconductor laser according to an embodiment.

FIG. 3 shows a typical epitactic starting structure for a WG-VCSEL (WG=Waveguide). The figure shows the substrate 1 on which are successively applied, in a first epitactic growth process, as an n-doped semiconductor layer an epitactic Bragg reflector 2, an active zone 3 and a p-doped semiconductor layer 4. In this embodiment, the substrate comprises n-doped InP. P-doped semiconductor layer 4 is an InP or InAlAs layer. If layer 4 consists of InAlAs, another p-doped InP or InGaAs layer 5 may optionally be provided. An n-doped barrier layer 6 is then applied to p-doped semiconductor layer 4. The barrier layer 6 preferably comprises a material which can be etched selectively against the material of the p-doped layer 5 or the layer 4, if layer 5 is missing. For example, the adjacent layer 4 or 5 is comprised of InP and the barrier layer 6 is comprised of InGaAsP.

Figure 4:
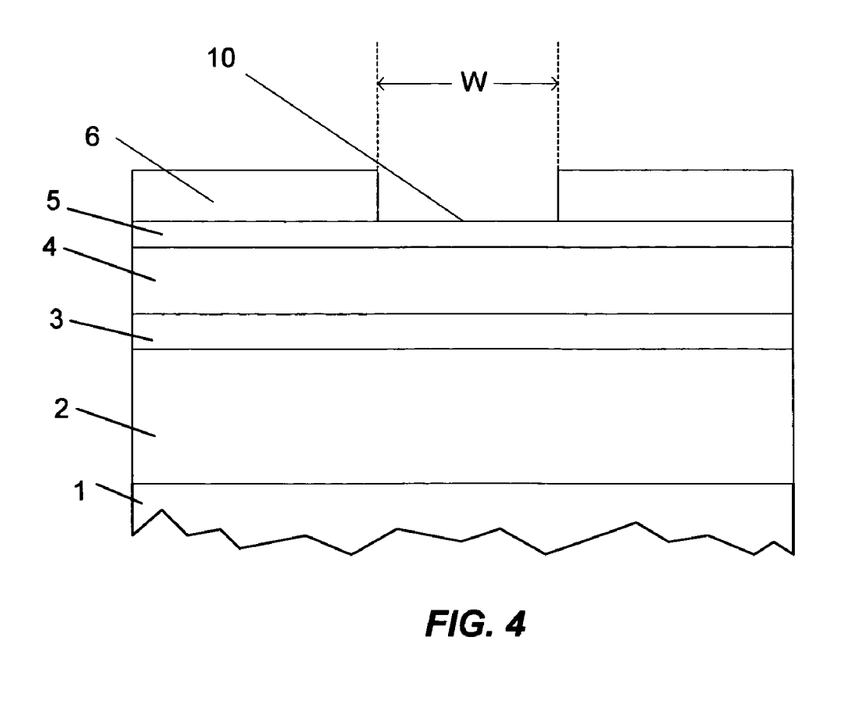
FIG. 4 shows the starting structure of FIG. 3 with an aperture provided in the topmost layer.

FIG. 4 shows the results of the subsequent lithographic and etching process, in the course of which a round, elliptical, square, rectangular or otherwise shaped aperture 10 is produced, passing through barrier layer 6 as far as the adjacent p-doped semiconductor layer 5. FIG. 4, for example, shows a round aperture 10 with a circular diameter w, whilst the remaining circular area of the layer 6 is hereinafter referred to as 6a.

Figure 5:
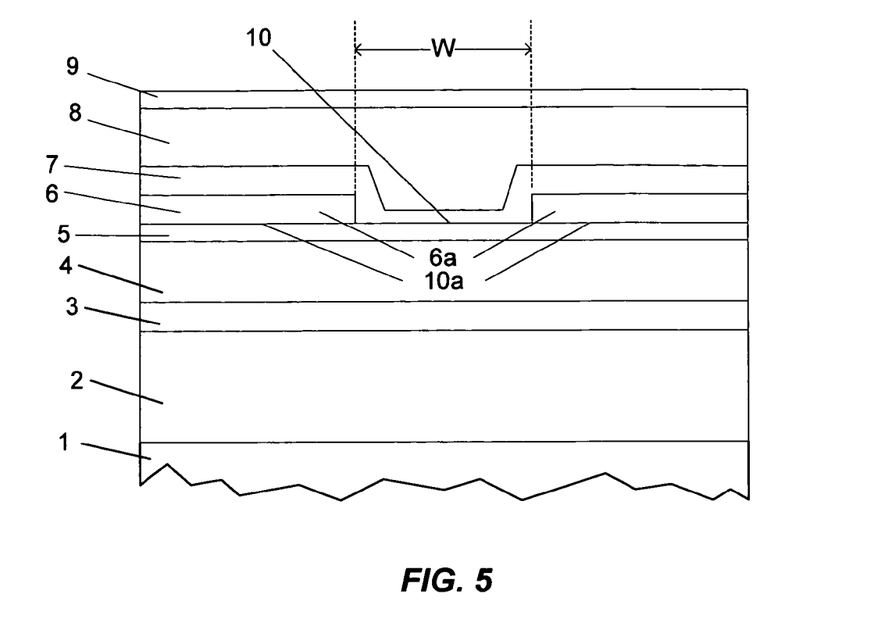
FIG. 5 shows the structure from FIG. 4 after overgrowth with further layers.
Figure 6:
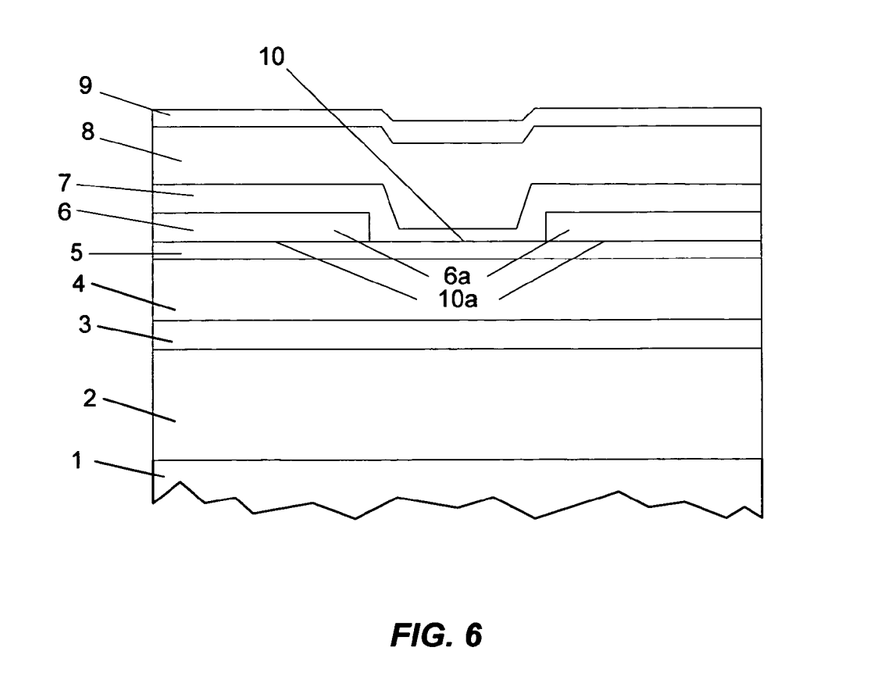
FIG. 6 shows an alternative to the structure according to FIG. 5.

In similar manner to known BTJ-VCSELs described above, in a second epitaxial step, the layer intended for the tunnel junction 7 including, for example, a highly p- and n-doped InGaAs layer, an upper n-doped confinement layer 8 preferably comprised of InP, and an optional n-contact layer 9 preferably comprised of highly n-doped InGaAs are applied. FIGS. 5 and 6 show two alternative results in which, depending on the process parameters or the epitaxy methods, the lateral structuring of the aperture 10 may be smoothed out (FIG. 5) or largely retained (FIG. 6). Epitaxy methods include for example MBE (Molecular Beam Epitaxy), CBE (Chemical Beam Epitaxy) and MOVPE (Metal Organic Vapour Phase Epitaxy).

As explained previously, in the overgrown structure, the electric current (polarity: + at the top and − at the bottom) can flow only in the region of aperture 10, as a blocking p-n-p-n structure has been produced with the semiconductor layers 5, 6, 7 and 8 outside aperture 10. In particular, the interface 10a between the p-doped semiconductor layer and the barrier layer 6 has a good barrier effect. As a result, the laser-active area within the laser-active layer 3 is laterally determined substantially by the shape and size of aperture 10. At the same time a lateral waveguide which is also determined by aperture 10 can be produced by a suitable choice of layer thickness for the barrier layer 6, which is therefore laterally adjusted precisely to the laser-active area. This may be explained with reference to FIGS. 8 and 9.

Figure 8:
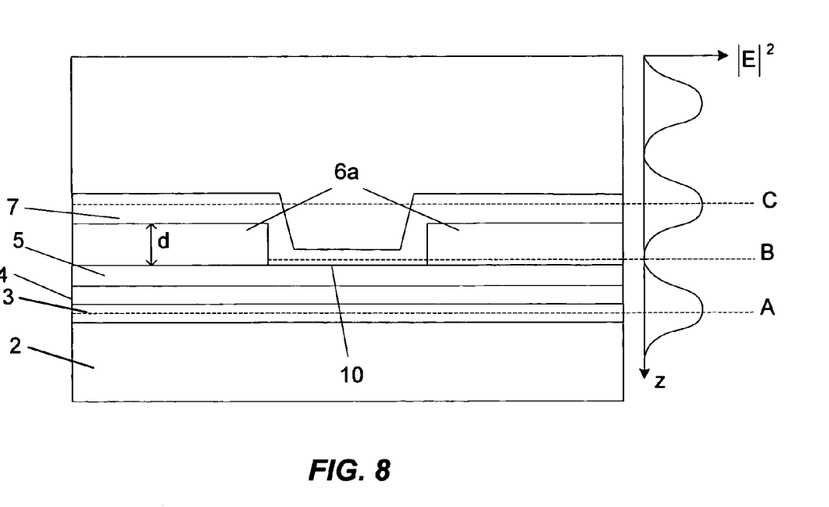
FIG. 8 shows a possible arrangement of the layers in relation to the field pattern.

In FIG. 8 the layer thickness d of the barrier layer 6a is substantially equal to half the distance between two minima in the vertical intensity distribution of the electric field strength, as shown at the right-hand edge of the layer structure. The structure shown in FIG. 8 allows strong wave guiding. Weak wave guiding is obtained with a structure according to FIG. 9 with an annular barrier layer 6a of very small thickness d.

It should be noted that tunnel junction layer 7 is generally highly absorbent on laser radiation on account of the high doping and/or low band spacings required for the tunnel effect. In every case, within the aperture 10, i.e., in the laser-active area, the active layer 3 (section A in FIGS. 8 and 9) and the tunnel junction 7 in the region of the aperture 10 (section B in FIGS. 8 and 9) are located in a maximum and a minimum, respectively. The active zone located in the maximum thus experiences maximization of amplification, whereas the tunnel junction located in the minimum leads to minimizing of losses.

Figure 9:
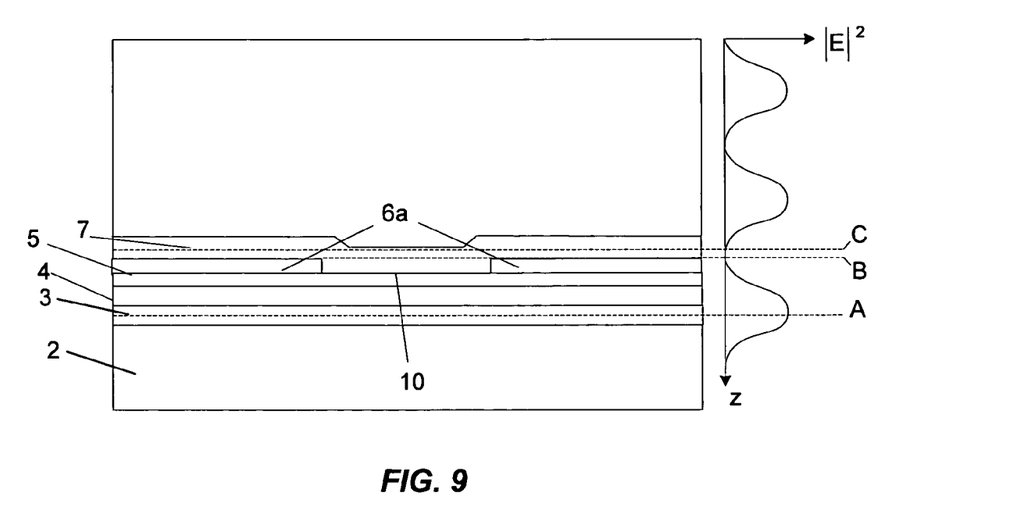
FIG. 9 shows an alternative positioning of the layers in relation to the field pattern.

The vertical position of the tunnel junction 7 outside the aperture 10 (Section C), on the other hand, depends on the thickness d of the barrier layer 6a and may for example be located in a maximum of the field (FIG. 8) or in a minimum of the field (FIG. 9). In the former case, the part of the laser field located in the outer region (outside the aperture 10) undergoes considerable attenuation and/or variation of the effective refractive index, if the refractive index of the tunnel junction layer 7 differs from that of the outer layer/confinement layer 8. As a result of the radial gradient of the optical intensification or the losses at the edge of aperture 10, the basic mode is narrowed down to aperture 10. Higher modes are greatly attenuated on account of their stronger field spurs in the outer area and cannot therefore start up. The structure according to FIG. 8 therefore allows single mode operation with a high laser output.

The other extreme case of weak wave guiding is illustrated in FIG. 9. If the thickness d of the barrier layer 6a is selected to be very small, little or no wave guiding is obtained. The attenuation outside the aperture 10 is slight and higher modes are less strongly attenuated and are able to start up.

FIGS. 8 and 9 show that by varying the thickness d of the barrier layer 6a the lateral wave guiding and mode selection can be continuously adjusted within a wide range in the WG-VCSEL.

Figure 7:
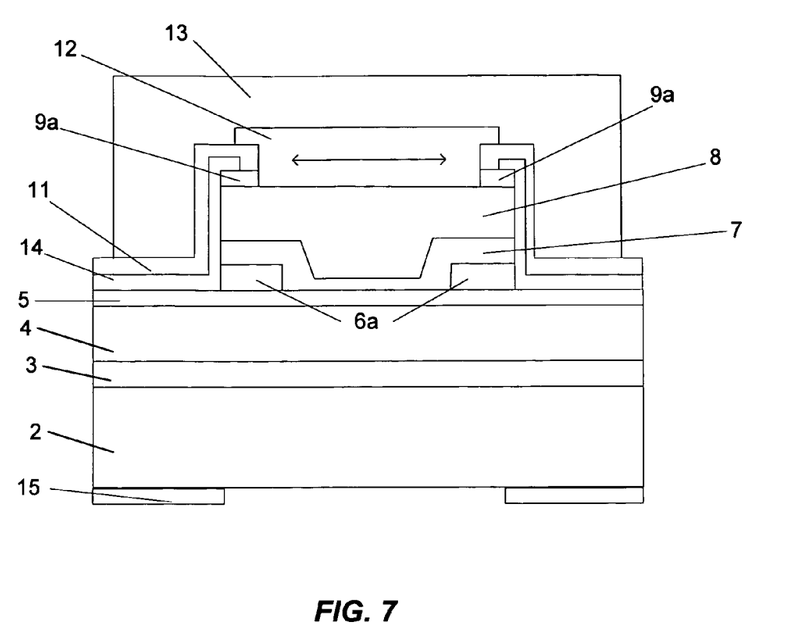
FIG. 7 schematically shows the finished semiconductor laser according to an embodiment.

Finally, FIG. 7 shows the structure of the finished semiconductor laser according to an embodiment with wave guiding (WG-VCSEL). In the finished WG-VCSEL the original n-InP substrate 1 has been totally removed and an n-end contact 15 has been fitted. On the n-doped confinement layer 8 is an annular p-end contact layer 9a, which encloses a dielectric mirror 12. The p-end contact 11 (e.g. Au/Ti/Pt/Au) is separated from the n-doped confinement layer 8 by an insulating and passivating layer 14 (e.g. consisting of $Si_3N_4$ or $Al_2O_3$). On this structure is the surrounding integrated gold heat sink 13. The n-end contact 15 consists of Ti/Pt, for example. The laser light emerges from the semiconductor laser on its side.

Finally, it should be pointed out that the active zone 3 which is shown as a homogeneous layer usually consists of a layer structure of, for example, 11 thin layers (5 quantum film and 6 barrier layers).

The present instrumentalities make it possible to manufacture a VCSEL with waveguide structure having a continuously adjustable range of lateral wave guiding and mode selection. The single mode performance (output) is increased compared with previously known laser diodes.

What is claimed is:

1. A surface-emitting semiconductor laser, comprising:
   an active zone having a pn transition, surrounded by a first n-doped semiconductor layer and at least one p-doped semiconductor layer;
   a second n-doped semiconductor layer;
   a tunnel junction on the p-side of the active zone and adjacent to the second n-doped semiconductor layer; and
   an n-doped barrier layer disposed, except for an aperture area, between the tunnel junction and the at least one p-doped semiconductor layer on the p-side of the tunnel junction.

2. The semiconductor laser according to claim 1, wherein in the region of the aperture the tunnel junction is applied directly to the p-doped semiconductor layer.

3. The semiconductor laser according to claim 1, wherein the layer thickness of the barrier layer is within a range from about $0<d<\lambda/2$, where d is the layer thickness and $\lambda$ is the distance between two minima of the vertical intensity distribution of the electric field strength.

4. The semiconductor laser according to claim 1, wherein the barrier layer comprises a material which is selectively etchable against the adjacent p-doped semiconductor layer.

5. The semiconductor laser according to claim 1, wherein the barrier layer comprises InGaAs and the adjacent p-doped semiconductor layer comprises InP.

6. The semiconductor laser according to claim 1, wherein the active zone is arranged in a maximum of the vertical intensity distribution of the electric field strength and the tunnel junction in the region of the aperture is arranged in a minimum of the vertical intensity distribution of the electric field strength.

7. The semiconductor laser according to claim 1, wherein the tunnel junction outside the area of the aperture is arranged in a maximum of the vertical intensity distribution of the electric field strength.

8. The semiconductor laser according to claim 1, wherein a n-doped contact layer at least partially adjoins the second n-doped semiconductor layer adjoining the tunnel junction.

9. The semiconductor laser according to claim 1, wherein a dielectric mirror at least partially adjoins the second n-doped semiconductor layer adjoining the tunnel junction.

10. The semiconductor laser according to claim 1, wherein the first n-doped semiconductor layer is provided as an n-doped epitactic Bragg reflector.

11. The semiconductor laser according to claim 1, wherein a p-doped InP layer is provided as the at least one p-doped semiconductor layer.

12. The semiconductor laser according to claim 1, wherein a p-doped InAlAs layer and a p-doped InP layer are provided as the at least one p-doped semiconductor layer.

13. The semiconductor laser according to claim 1, wherein the layer provided for the tunnel junction comprises a highly p- and n-doped InGaAs layer.

14. The semiconductor laser according to claim 1, wherein the second n-doped semiconductor layer adjacent to the tunnel junction comprises InP.

15. The semiconductor laser according to claim 1, wherein the contact layer comprises highly n-doped InGaAs.

16. The semiconductor laser according to claim 1, wherein a p-doped InAlAs layer is provided as the at least one p-doped semiconductor layer.

17. The semiconductor laser according to claim 1, wherein a p-doped InAlAs layer and a p-doped InGaAs layer are provided as the at least one p-doped semiconductor layer.

18. The semiconductor laser according to claim 1, wherein the barrier layer comprises InGaAsP and the adjacent p-doped semiconductor layer comprises InP.

* * * * *